US009065242B2

(12) United States Patent
Chen et al.

(10) Patent No.: US 9,065,242 B2
(45) Date of Patent: Jun. 23, 2015

(54) APPARATUS AND METHOD TO ENABLE PRECISION AND FAST LASER FREQUENCY TUNING

(75) Inventors: Jeffrey R. Chen, Clarksville, MD (US); Kenji Numata, College Park, MD (US); Stewart T. Wu, Glen Burnie, MD (US); Guangning Yang, Clarksville, MD (US)

(73) Assignee: The United States of America as represented by the Administrator of the National Aeronautics Space Administration, Washington, DC (US)

( * ) Notice: Subject to any disclaimer, the term of this patent is extended or adjusted under 35 U.S.C. 154(b) by 199 days.

(21) Appl. No.: 13/474,053

(22) Filed: May 17, 2012

(65) Prior Publication Data

US 2013/0308663 A1 Nov. 21, 2013

(51) Int. Cl.
*H01S 3/10* (2006.01)
*H01S 5/0625* (2006.01)
*G01S 7/484* (2006.01)
*H01S 3/13* (2006.01)
*H01S 5/0687* (2006.01)

(52) U.S. Cl.
CPC ............. *H01S 5/06256* (2013.01); *G01S 7/484* (2013.01); *H01S 3/1304* (2013.01); *H01S 3/1305* (2013.01); *H01S 5/0687* (2013.01)

(58) Field of Classification Search
USPC ............................... 372/20, 28, 29.01, 29.011
See application file for complete search history.

(56) References Cited

U.S. PATENT DOCUMENTS

| 3,936,762 A | * | 2/1976 | Cox et al. | 327/159 |
| 5,383,210 A | * | 1/1995 | Ichikawa | 372/29.021 |
| 2010/0303111 A1 | * | 12/2010 | Kupershmidt | 372/32 |

* cited by examiner

*Primary Examiner* — Yuanda Zhang

(57) ABSTRACT

An apparatus and method is provided to enable precision and fast laser frequency tuning. For instance, a fast tunable slave laser may be dynamically offset-locked to a reference laser line using an optical phase-locked loop. The slave laser is heterodyned against a reference laser line to generate a beatnote that is subsequently frequency divided. The phase difference between the divided beatnote and a reference signal may be detected to generate an error signal proportional to the phase difference. The error signal is converted into appropriate feedback signals to phase lock the divided beatnote to the reference signal. The slave laser frequency target may be rapidly changed based on a combination of a dynamically changing frequency of the reference signal, the frequency dividing factor, and an effective polarity of the error signal. Feed-forward signals may be generated to accelerate the slave laser frequency switching through laser tuning ports.

10 Claims, 5 Drawing Sheets

APPARATUS AND METHOD TO ENABLE PRECISION AND FAST LASER FREQUENCY TUNING

ORIGIN OF THE INVENTION

The invention described herein was made in the performance of work under a NASA contract and by an employee of the United States Government and is subject to Public Law 96-517 (35 U.S.C. 5200 et seq.).

FIELD

The present invention relates to wavelength tuning, and more particularly, to a precision and fast wavelength tuning technique for a desired wavelength.

BACKGROUND

Previous laser seeders for remote-sensing lidars generate required wavelength-stepped pulse trains by combining multiple externally amplitude-modulated lasers. Using multiple fixed-wavelength lasers and corresponding multiple modulators may cause issues with respect to the reliability and measurement performance, as well as increase power consumption, size, mass, and cost. Thus, it may be desirable to replace the fixed-wavelength distributed feedback laser diodes and their modulators with a single precision fast wavelength-scanning laser and a modulator to drastically simplify the seeder architecture and to eliminate the optical crosstalk among different wavelength channels.

The wavelength of widely-tunable monolithic semiconductor diode lasers has been fast switched and locked within ~12 μs for a step size over 30 nm. Limited by the coarse frequency locking techniques employed in such demonstrations, the uncertainty of the locked laser frequency was as large as a few GHz, too large for many demanding applications. One or more embodiments of the present invention may drastically improve the frequency precision while retaining the fast tuning speed of such widely tunable lasers. The embodiments of the present invention may add fast tunability to an existing phase locked loop technique that offset-locks a slave laser to a frequency stabilized reference laser line.

SUMMARY

Certain embodiments of the present invention may provide solutions to the problems and needs in the art that have not yet been fully identified, appreciated, or solved by current laser tuning systems.

In one embodiment, a method is provided. The method includes generating a slave laser line fast tuned through at least a fast tuning port to at least a frequency near a reference laser line. The method also includes frequency dividing a detected beatnote between the slave laser line and the reference laser line, and detecting a phase difference between the divided beatnote and a reference signal to generate an error signal proportional to the phase difference. The method further includes converting the error signal into an appropriate feedback signal to phase lock the divided beatnote to the reference signal, and rapidly changing a slave laser frequency target based on a combination of a dynamically changing frequency of the reference signal, a frequency dividing factor, and an effective polarity of the error signal. The method may also include dynamically generating a feed-forward signal to accelerate the frequency switching of a slave laser to the target through the fast tuning port.

In one embodiment, an apparatus is provided for precision and fast laser frequency tuning. The apparatus includes a tunable slave laser module configured to generate a fast tunable slave laser. The apparatus also includes a heterodyne module configured to generate an electronic beatnote between the fast tunable slave laser and a reference laser line. The apparatus further includes a phase locked loop circuit module configured to generate feedback signals for tuning the fast tunable laser through a fast tuning port of the tunable slave laser module. The apparatus includes a tuning controller module configured to generate a feed-forward signal dynamically to accelerate the frequency switching of the fast tunable slave laser to the target through the fast tuning port, and to generate commands to rapidly change the frequency of the reference signal, the frequency dividing factor, and an effective polarity of the error signal.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Figure 1:
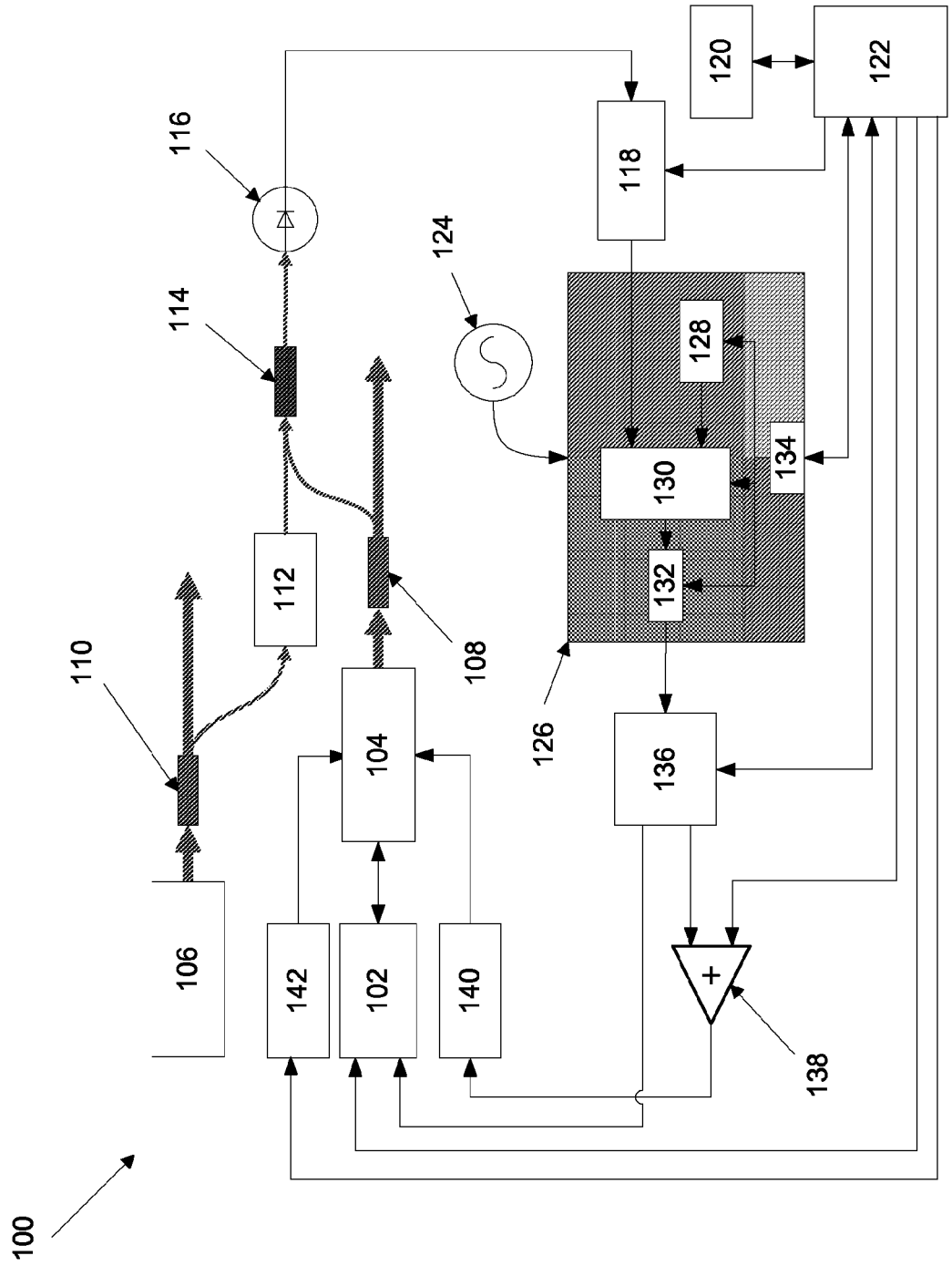
FIG. 1 illustrates an apparatus having an optical phase-locked loop with fast tuning ability, according to an embodiment of the present invention.

It will be readily understood that the components of the invention, as generally described and illustrated in the figures herein, may be arranged and designed in a wide variety of different configurations. Thus, the following detailed description of the embodiments is not intended to limit the scope of the invention as claimed, but is merely representative of selected embodiments of the invention.

The features, structures, or characteristics of the invention described throughout this specification may be combined in any suitable manner in one or more embodiments. For example, the usage of "certain embodiments," "some embodiments," or other similar language, throughout this specification refers to the fact that a particular feature, structure, or characteristic described in connection with an embodiment may be included in at least one embodiment of the invention. Thus, appearances of the phrases "in certain embodiments," "in some embodiments," "in other embodiments," or other similar language, throughout this specification do not necessarily all refer to the same embodiment or group of embodiments, and the described features, structures, or characteristics may be combined in any suitable manner in one or more embodiments.

One or more embodiments described herein use a single precision fast tunable laser and a single modulator to drastically simplify seed laser architecture and eliminate the optical crosstalk among different wavelength channels. This allows remote measurements of concentrations of trace gases, as well as water vapor and oxygen, to be made more efficiently and reliably. The embodiments described herein also add fast tunability to a PLL that offset-locks a slave laser to a reference laser line that is either a fraction of a frequency stabilized master laser or one laser line of an optical frequency comb (OFC) generated from the master laser. The beatnote between the slave laser and the reference laser line is frequency-divided by a factor of N and subsequently phase-locked to a changing radio frequency (RF) reference signal dynamically. Fast frequency switching may be achieved by using feed-forward tuning signals. Subsequent phase-lock is acquired rapidly by employing a fast locking logic. The PLL and field programmable gate array (FPGA) controlled fast electronics enable sub-MHz precision in laser frequency tuning faster than 40 μsec per frequency switch.

Feed-forward signals may be adaptively Optimized while the PLL is open or closed to minimize the offset frequency error monitored by the FPGA. PLL parameters, such as the error signal polarity and the RF reference signal frequency $f_R$, can be rapidly changed to facilitate fast laser frequency switching. The precision fast tuning range of a digital super-mode distributed Bragg reflector (DS-DBR) laser may be extended to ~40 nm by changing currents to additional timing ports and by referencing to a stabilized frequency comb generated from the master laser. The tuning range may be further extended to cover both C and L bands to measure multiple gas species. The slave laser may also be quasi continuously tuned in the closed PLL with the same high precision and fast speed within the wide tuning range.

FIG. 1 illustrates an apparatus 100 having an optical phase-looked loop with fast tuning ability, according to an embodiment of the present invention. This embodiment uses a dynamically tuned RE reference frequency and a fast tunable slave laser. The tunable slave laser may be offset locked to a reference laser line that is either a fraction of the master laser that is absolutely frequency locked to a frequency reference such as a molecular absorption line, or one laser line of an OFC generated from the master laser. Such an offset locking technique may allow a slave laser to be tuned precisely to any frequency $v_{slave}$ within, for example, a ±20 GHz range about the reference laser line frequency.

In order for the slave laser to retain the optical frequency precision of the master laser, the error in the offset frequency (that is, the actual offset frequency minus target offset frequency) is suppressed to a fraction of the frequency noise of the master laser. Various offset locking techniques may be used to lock the frequency difference between two lasers. To ensure the offset frequency accuracy, phase-lock techniques may be preferred over frequency-lock schemes. For example, an imperfection in the error signal zero-crossing point (due to temperature change, aging, etc.) may only result in a phase shift for PLL systems, rather than a frequency error as is the case for frequency-lock systems. The technique described herein provides fast tunability and uses PLL to offset-lock the slave laser to reference laser line in an OFC generated from the master laser. The fast tuning of the PLL enables precision and fast tuning of the laser. The design may also be applicable to other fast tunable lasers and other wavelengths.

In this embodiment, a beatnote between the slave laser and the reference laser line is frequency-divided and subsequently phase-locked to a RF reference signal dynamically. As shown in FIG. 1, a tunable laser unit 104 generates a slave laser line and a frequency stabilized master laser unit 106 generates a master laser line. The slave laser may be mounted on a thermoelectric cooler (TEC) and may be temperature stabilized by a TEC controller 102 to avoid laser frequency drift due to the temperature fluctuation. Coupler 108 splits a fraction, or approximately 1 percent, of the slave laser line and coupler 110 splits a fraction, or approximately 10 percent, of the master laser line. The remainder, or approximately 99 percent, of the slave laser line serves as the tunable laser output and the remainder, or approximately 90 percent, of the master laser line is used to stabilize the master laser frequency (not shown).

Figure 2:
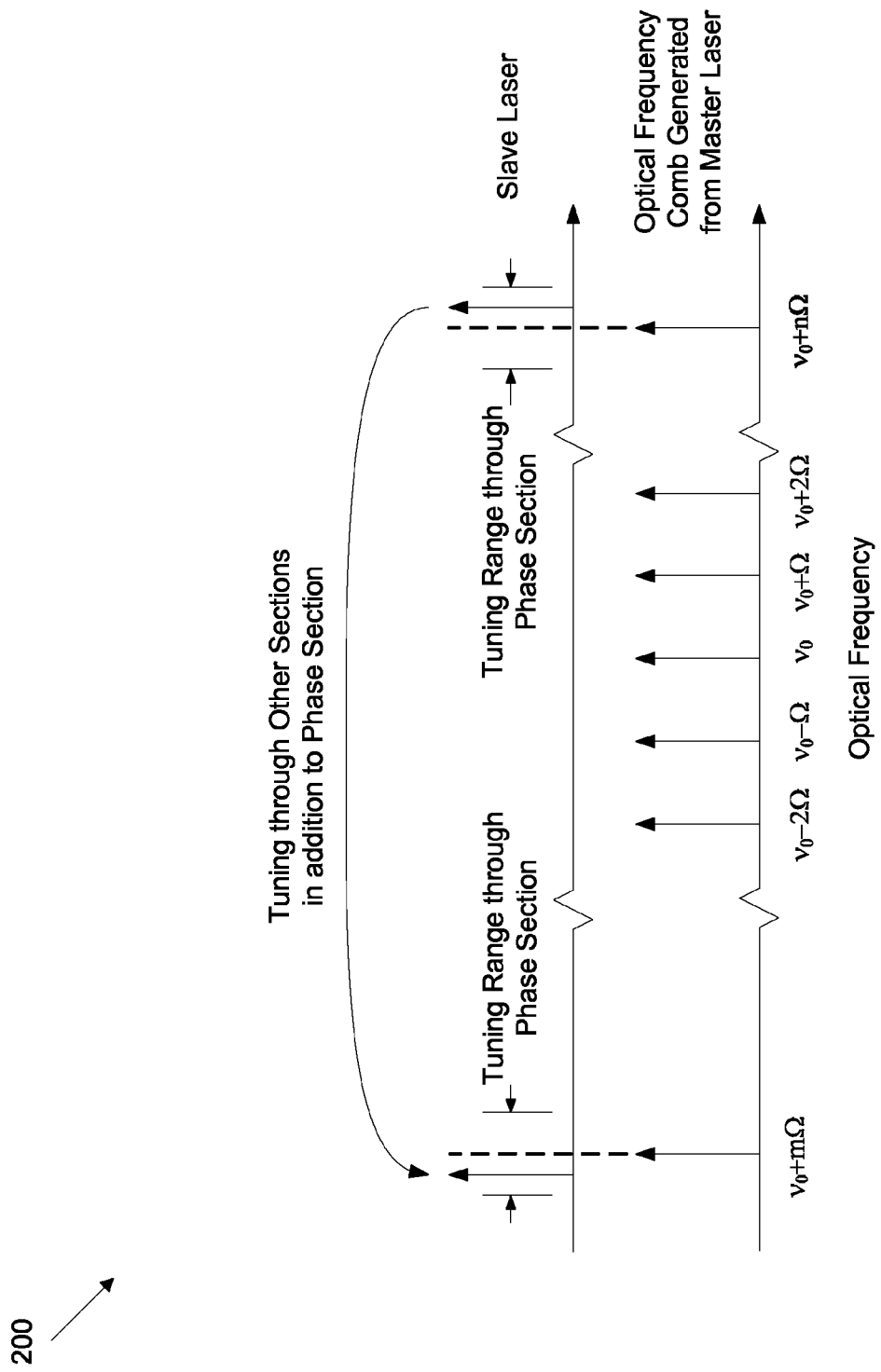
FIG. 2 illustrates a diagram of wide tuning facilitated by an optical frequency comb and additional tuning through other tuning ports, according to another embodiment of the present invention.

In certain embodiments, the fraction of the master laser line is passed to OFCG 112 that is configured to generate a comb of reference laser lines about the master laser frequency $v_0$. As to be explained later, the OFC may be used to extend the precision fast laser tuning range. As illustrated in FIG. 2, the reference laser lines of the OFC may be formed at $v_n = v_0 + n \cdot \Omega$ ($n = 0, \pm 1, \pm 2, \ldots$) by passing the master laser line through a phase modulator driven by an RF signal at a frequency $\Omega$.

Coupler 114 may then combine the fraction of the slave laser line and the output of OFCG 112 and the combined output may be passed to, and detected by, a photo-detector 116. Detector 116 generates an electrical beatnote as to be discussed later. In this embodiment, detector 116 may be band-limited to less than $\Omega/2$, to pick up the beatnote against the nearest reference laser line less than $\Omega/2$ away, but filters out beatnotes against other reference laser lines further than $\Omega/2$. Coupler 114 may be a 50 percent fiber coupler in this embodiment. However, the type of coupler used is a matter of design choice. Detector 116 includes a PIN photodiode followed by an integrated transimpedance amplifier (TIA). The frequency of the detected beatnote may be equal to the frequency difference between the slave and the reference laser line (i.e., $|v_{slave} - v_n|$).

The detected beatnote may be frequency-divided using one of more digital frequency dividers 118 by a factor of N to below the maximum frequency (e.g., 150 MHz) of a digital phase/frequency detector (PFD) 130. Depending on the configuration, N may be 1, 2, 4, 8, 16, 32, 64, 128, or 256. The changing RF reference signal may be generated by a direct digital synthesizer (DDS) 128. The total frequency-dividing factor N may be the product of the dividing ratios of all the frequency dividers $N_1, N_2, \ldots, N_N$.

In this embodiment, an integrated circuit (IC) chip 126 may include a PFD 130, a DDS 128, a charge pump (CP) 132, and input output (I/O) port 134. IC chip 126 is externally driven in this embodiment by, for example, a 1 GHz reference clock 124. The frequency of the reference frequency signal and other parameters can be rapidly switched in less than 400 ns by sending digital commands from FPGA module 122 to IC chip 126, via I/O port 134.

PFD 130 may detect the phase difference and frequency difference between the divided beatnote and the electronic reference signal generated by DDS 128, and may drive CP 132 to generate an error signal determined by the following fast locking logic that may be provided by the IC chip 126. When a substantial frequency error is detected, the CP is switched to a frequency detect mode to supply a fixed error signal to drive the loop towards frequency lock. The CP is then switched to an intermediary wide closed-loop mode to quickly achieve phase lock. When the intermediary closed-loop mode achieves phase lock as determined by a lock detector (not shown), PFD 130 and CP 132 transition into the final closed-loop state. The error signal may be proportional to the phase difference for both closed-loop modes, with higher phase sensitivity for the intermediary closed loop mode. Servo 136 turns the error signal into two appropriate feedback signals and feeds the feedback signals to the slave laser to correct its optical frequency. For example, one of the feedback signals slowly adapts the laser temperature through a thermoelectric cooler (TEC) controller 102, while the other feedback signal $V_{FB}(t)$ rapidly adjusts the current to a fast tuning port (e.g., a phase section of a DS-DBR laser). A temperature setting signal from FPGA module 122 may also be sent to TEC controller 102 to adjust the slave laser frequency, external to the PLL.

Such a PLL locks the phase of the divided beatnote to that of the reference frequency signal, forcing the offset frequency to be exactly equal to its target Sign·N·$f_R$. It should be appreciated that Sign can be either + or −, depending on the effective polarity of the error signal. All the three factors, and hence, the offset frequency target may be rapidly switched by sending digital commands from FPGA module 122 to IC chip 126 and to frequency dividers 118. In this embodiment, FPGA module 122 is on the bus of a host computer 120 that controls the FPGA.

The following is a description of fast tuning through the fast tuning port alone.

The frequency of a DS-DBR laser, for example, may be fast tuned through its phase section within ±20 GHz. FPGA nodule 122 may also generate a feed-forward signal $V_{FW}(t)$ to the fast tuning port, such that the laser offset frequency may closely follow the moving offset frequency target. This feed-forward signal $V_{FW}(t)$ may be combined with PLL feedback signal $V_{FW}(t)$ at adder 138 and the sum may be fed to a modulation input of a current driver 140 that drives the fast tuning port to tune slave laser unit 104.

The feed-forward signal $V_{FW}(t)$ can be approximately computed from offset frequency target Sign·N·$f_R$ and the laser frequency tuning response. Both feed-forward signal values and digital commands (as time series) may be loaded to the memory of FPGA module 122 beforehand. This allows FPGA module 122 to rapidly and synchronously generate both feed-forward signal $V_{FW}(t)$ and commands to switch the offset frequency target in real time.

It should be appreciated that feed-forward signal $V_{FW}(t)$ by itself can drive the laser frequency to closely track the moving offset frequency target, leaving a small residual offset frequency error between the actual offset frequency and a desired target Sign·N·$f_R$.

To improve target tracking (i.e., reducing residual offset frequency error), the feed-forward signal can be optimized dynamically in real time or offline periodically. For example, an offset frequency error signal produced by the servo 136 (from the phase error signal) and feedback signal $V_{FB}(t)$ may be monitored by FPGA module 122 in real time. As a result, corrections to feed-forward signal $V_{FW}(t)$ can be computed accordingly from the offset frequency error and feedback signal $V_{FB}(t)$ by using an adaptive algorithm to minimize both of them. By activating a fast locking logic, this frequency error may be quickly eliminated in the frequency detect mode, allowing more tolerance to the error in feed-forward signal $V_{FW}(t)$. It should be appreciated a higher CP gain is used in the intermediary closed-loop mode to allow faster phase lock acquisition than achievable with a stable PLL. Overall, the fast looking logic may significantly shorten the phase lock acquisition time. The fast locking logic parameters may also be dynamically controlled by FPGA module 122. The tuning speed may ultimately be limited by the tuning response time of the slave laser and not the electronics. Once in the final closed-loop state, the residual phase error may be suppressed by the PLL by a factor of G(f) +1, where G(f) is the open-loop gain of the PLL in the final closed-loop state as a function of the Fourier frequency f.

When the slave laser frequency needs to go from one side of the reference laser frequency to the other, the error-signal polarity needs to be, in effect, flipped. FPGA module 122 dynamically triggers this polarity change either by sending a command to change the current polarity of CP 132 or by triggering switches in servo 136. While the frequency of the beatnote changes in a range as large as ±20 GHz, the frequency dividing factor N needs to be changed at certain points to keep the frequency of the divided beatnote below, but not too far below, the 150 MHz limit of a particular IC chip 126, to maintain sufficient phase sensitivity. Table 1 lists a time sequence of the error signal polarity, the dividing factor N, and the reference frequency $f_R$ as the slave laser is switched through the 8 frequencies across a $CO_2$ absorption line.

TABLE 1

| Time (μsec) | Offset Frequency (GHz) | Reference Frequency $f_R$ (MHz) | Dividing factor N of Frequency Dividers | Sign of Error Signal Polarity |
|---|---|---|---|---|
| 0 | −15.6 | 81.25 | 192 | − |
| 100 | −1.70 | 106.25 | 16 | − |
| 200 | −1.08 | 67.5 | 16 | − |
| 300 | −0.50 | 62.5 | 8 | − |
| 400 | +0.50 | 62.5 | 8 | + |
| 500 | +1.08 | 67.5 | 16 | + |
| 600 | +1.70 | 106.25 | 16 | + |
| 700 | +15.6 | 81.25 | 192 | + |
| 800 | −15.6 | 81.25 | 192 | − |

Open loop gain G(f) may be optimized to be sufficiently high in a wide bandwidth to suppress the phase error, while having proper phase and amplitude margins to maintain the PLL stability. It should be noted that open loop gain G(f) may be proportional to 1/N and the laser frequency tuning response of the fast tuning port. As to be discussed below, the tuning response changes with the tuning current to the fast tuning port. In certain embodiments, an optimized open loop gain G(f) may be kept unchanged when N and the tuning response are changed, by changing gains in other sections of the PLL, accordingly. For example, the gain of servo 136 or the current gain of CP 132 can be dynamically changed (by FPGA module 122) to compensate gain changes proportional to 1/N and the tuning response of the fast tuning port.

In certain embodiments, the tuning range can be extended beyond that available through the fast tuning port, by additional tuning through other tuning ports (such as the front and rear mirror sections of a DS-DBR laser), as illustrated in FIG. 2. To do this, additional feed-forward signals may be sent from the FPGA module 122 to current drivers 142 to rapidly change their currents to these other tuning ports. The feed-forward signals to the fast tuning port and these other tuning ports may need to be switched jointly. The same PLL may then offset lock the slave laser to the target through the feedback to the fast tuning port. Furthermore, a separate optical reference laser line may be placed near the target frequency so that the beatnote frequency falls within the electronic bandwidth of detector 116.

For such wider tuning, a reference optical frequency comb may be used so that the beatnote frequency can be kept below ~20 GHz. Rather than beating against a single master laser line, the slave laser can beat against multiple lines of an optical comb that is passed to coupler 114 and combined with the 1 percent of the slave laser power. By rapidly changing the currents to the front and rear mirror sections of a DS-DBR laser, the laser frequency can be fast tuned over the entire C-band or L-band. The FPGA module 122 may be configured to wait on a triggering pulse to start each frequency switch, allowing synchronization of each frequency switching with a subsequent laser pulse carving. In order to tune 110 GHz (i.e., 0.9 nm) for an $O_2$ sensor, for example, the rear mirror current may only need to be tuned in conjunction with the phase current tuning. The rear mirror current alone can tune the tunable laser unit 104 up to ~7 nm, more than enough to cover a single or double absorption lines of any species.

The OPC may be generated by coupling the master laser line into an OFCG ring where a phase modulator and a fiber amplifier create and amplify the reference laser lines, respectively. The reference laser lines may circulate in the OFCG ring and become even in amplitude. The same coupler may pick off the reference laser lines, forming the frequency comb. An unlocked frequency jump may be necessary when moving from one reference laser line to another.

It should be noted that the laser frequency tuning response (vs. tuning current) in general might be nonlinear for the tuning ports. Choosing current steps in a nonlinear fashion can linearize the tuning response. To do this for a DS-DBR laser, smaller steps are taken at low currents where the induced refractive index changes most rapidly with the current. This nonlinear pattern should be taken into account in computing the feed-forward signals. By using pre-emphasis at the beginning of the feed-forward pulses, the switching times can be significantly reduced.

The slave laser can also be precisely tuned continuously in a closed PLL between discontinuity frequency points caused by laser mode hopping, jumping from one reference laser line to another, and other discrete changes in the PLL parameters. Such continuous and quasi (piecewise) continuous tuning can have even faster speed and the same sub-MHz precision, and are also invaluable to many applications. The tuning range can be further extended to cover both C-band and L-band by combining two slave lasers, one in each band, using a wavelength division multiplexer (WDM).

Figure 3:
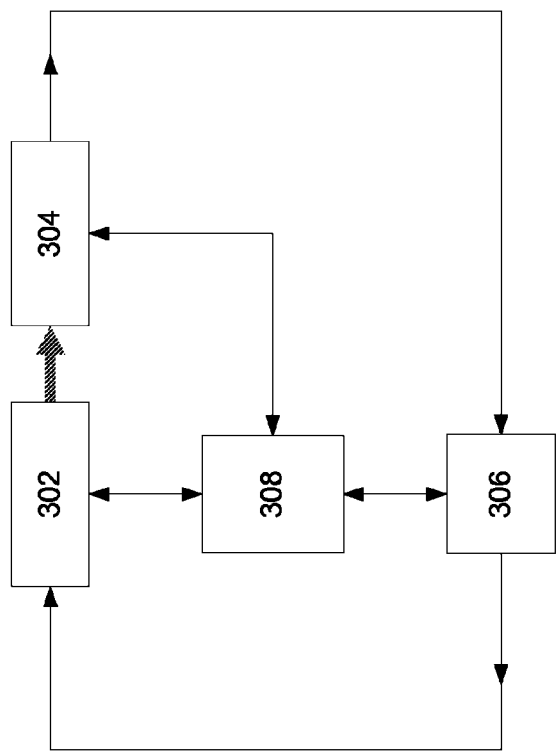
FIG. 3 illustrates an apparatus for enabling precision and fast laser tuning functionality, according to an embodiment of the present invention.

FIG. 3 illustrates an apparatus 300 for enabling the precision and fast laser tuning functionality, according to an embodiment of the present invention, Apparatus 300 includes four functional modules, e.g., a tunable slave laser module 302, a heterodyne module 304, a PLL circuit module 306, and a tuning controller module 308. Tunable slave laser module 302 includes a fast tunable laser and its current drivers and a TEC controller. The laser frequency can be fast tuned through tuning ports to the current drivers and slowly adjusted through the TEC controller. Tunable slave laser module 302 receives a feedback signal from PLL circuit module 306 and a feed-forward signal from tuning controller module 308, adds the two signals internally, and feeds the sum to a fast laser tuning port. Tunable slave laser module 302 may also receive additional feed-forward signals at other laser tuning ports and a temperature setting signal at the TEC controller from tuning controller module 308. Tunable slave laser module 302 may further receive a slow feedback signal at the TEC controller from PLL circuit module 306. Tuning controller module 308 may also set and monitor other parameters of the slave laser module 302.

Figure 4:
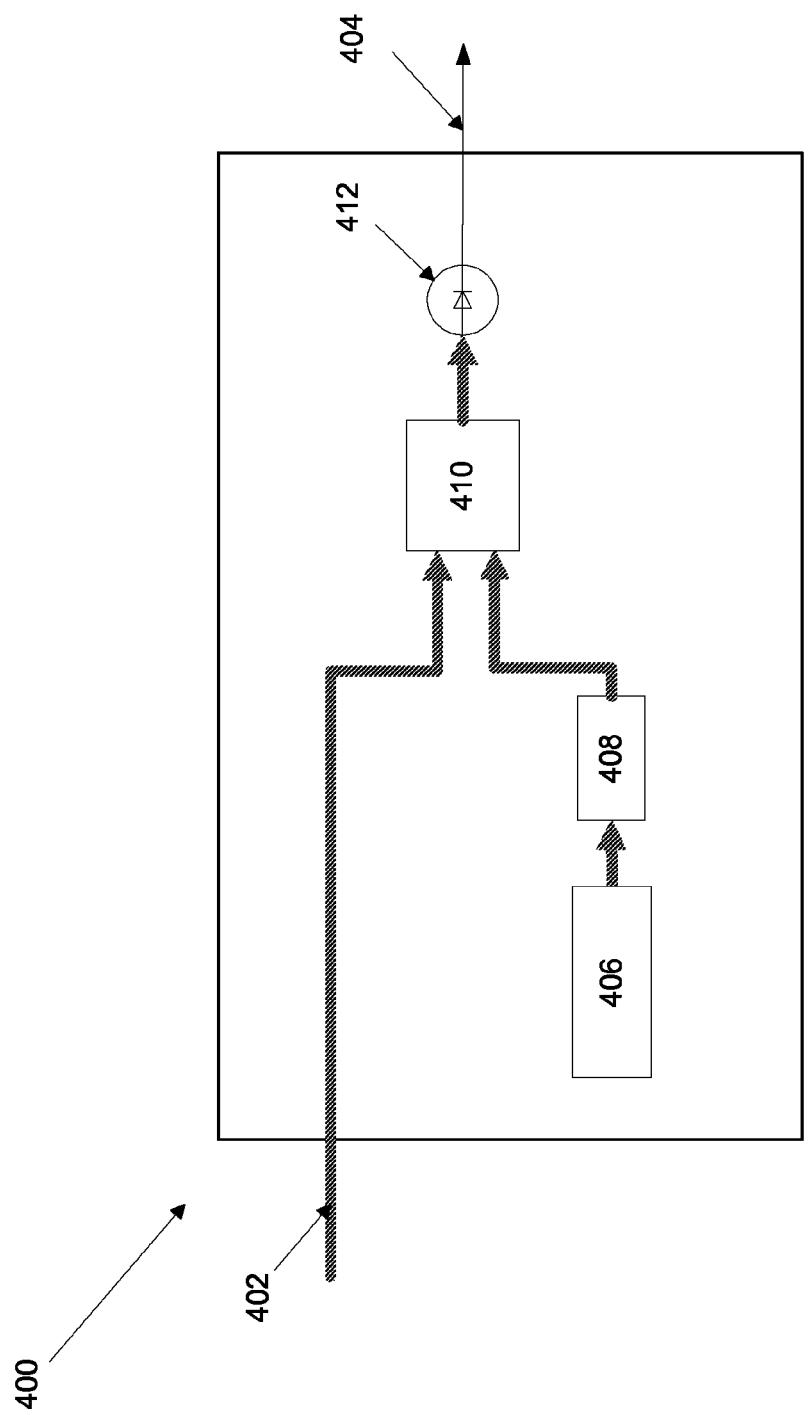
FIG. 4 illustrates a heterodyne module for generating the beatnote, according to an embodiment of the present invention.
Figure 5:
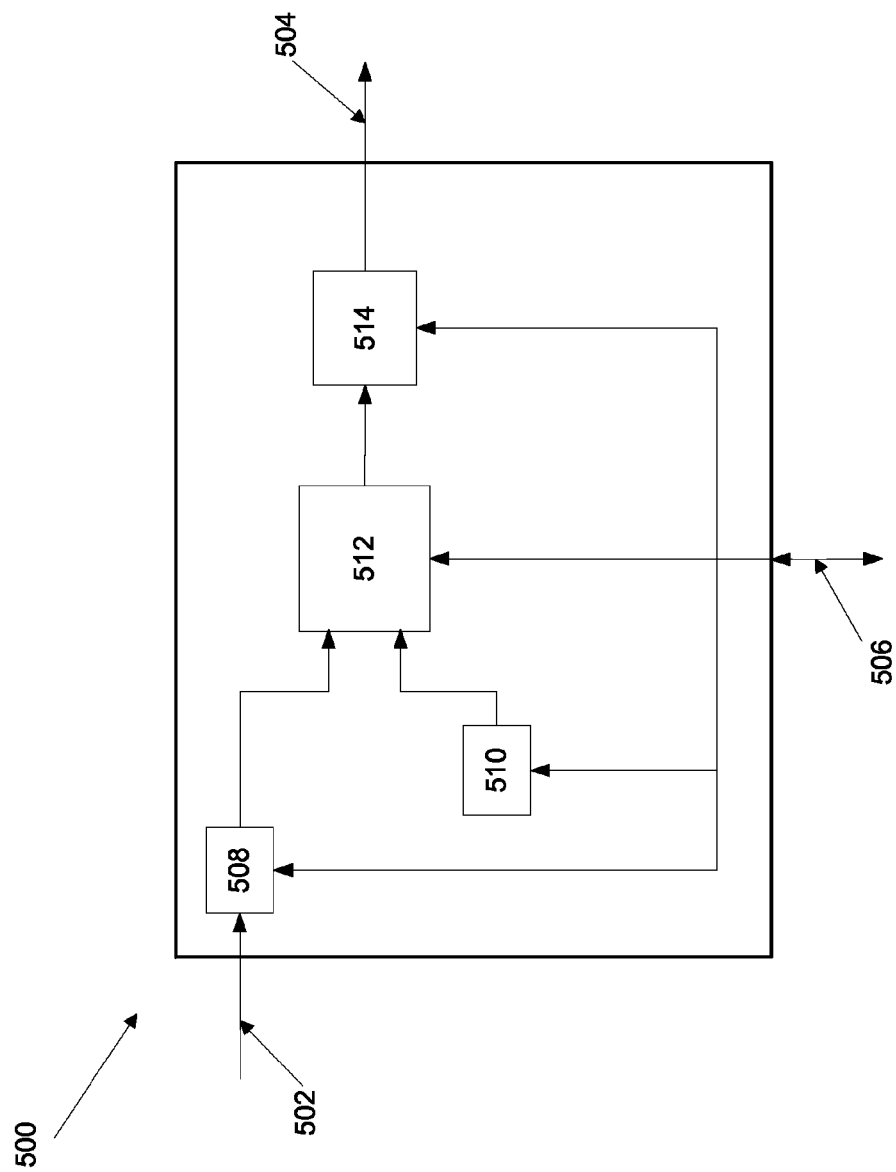
FIG. 5 illustrates a phase locked loop (PLL) circuit module for creating feedback signals, according to an embodiment of the present invention.

Heterodyne module 304 may generate an electronic beatnote between the slave laser and a reference laser line, as illustrated in FIG. 4. A PLL, circuit module 306 may generate the feedback signals to the tunable slave laser module 302, as illustrated in FIG. 5. It should be appreciated that tunable slave laser module 302, heterodyne module 304, and PLL circuit module 306 form a PLL, and each of these modules may be controlled by tuning controller module 308 in this embodiment, FIG. 4 illustrates a heterodyne module 400 for generating the beatnote, according to an embodiment of the present invention. In this embodiment, a fraction of a tunable slave laser is received at an input port 402, and is heterodyned against a reference laser line that is either a fraction of a master laser 406 or one laser line of an OFC generated by an OFCG 408 from the master laser. The two laser lines are combined with a coupler 410 and the combined output is passed to, and detected by, an optical detector 412 to generate an electrical beatnote. The electrical beatnote may then be transmitted, via output port 404 to the PLL circuit module shown in FIG. 5. The tuning controller module in FIG. 3 may also set and monitor parameters of heterodyne module 400, such as the frequency spacing of the OFC.

FIG. 5 illustrates PLL circuit module 500 for creating feedback signals, according to an embodiment of the present invention. The electrical beatnote is received at input port 502 and is frequency divided by a factor of N by one or more frequency dividers 508. It should be noted that PFD 512 may also include a CR PFD 512 may detect a phase difference and frequency difference between the divided beatnote and an electronic reference signal generated by a reference signal generator 510, and generates an error signal determined by a fast locking logic similar to the one described earlier. The fast locking logic may be built in PFD 512 to determine the error signal as follows. When a substantial frequency error is detected, PFD 512 supplies a large configurable error signal to drive the loop towards frequency lock. The error signal may then become proportional to the phase difference, with higher phase sensitivity for an intermediary closed loop mode. Servo 514 (also referred to as loop filter) converts the error signal into two appropriate feedback signals that may be fed back, via output port 504, to the fast tuning port and the TEC controller in the tunable slave laser module shown in FIG. 3.

Tuning controller module 308, as depicted in FIG. 3, may set and monitor parameters of the PLL circuit module 500, via an I/O port 506. The frequency of the reference signal, the frequency dividing factor N, the effective polarity of the error signal, the gains in PFD 512 and servo 514, and settings of the fast locking logic may be dynamically changed based on digital commands from tuning controller module 308, for purposes stated earlier. Tuning controller module 308 may also monitor the feedback signals and the frequency difference between the divided beatnote and the reference signal, and may adapt the feed-forward signal to the fast tuning port accordingly to minimize the frequency difference and the feedback signals.

Tuning controller module 308 in FIG. 3 may wait on a triggering pulse to start each frequency switch of the slave laser. Tuning controller module 308 may be based on one or more FPGA modules.

Embodiments of the present invention pertain to a precision and fast wavelength tuning technique for a laser. For example, a widely tunable DS-DBR laser may be dynamically offset-locked to a frequency-stabilized master laser using an optical phase-locked loop, enabling precision fast tuning to and from any frequencies within a ~40-GHz tuning range. This tuning range is attainable through the phase section alone, matched by a 20-GHz optical detector. The precision and fast tuning range may be extended to the C or L band by additional tuning through the front and rear mirror sections, and by referencing to an OFC generated from the master laser. The offset frequency noise may be suppressed to the statically offset-locked level in less than ~40 µs upon each frequency switch, allowing the laser to retain the absolute frequency stability of the master laser. This technique satisfies stringent requirements for gas sensing lidars and enables other applications that require such well-controlled precision fast tuning.

One having ordinary skill in the art will readily understand that the invention as discussed above may be practiced with steps in a different order, and/or with hardware elements in configurations that are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A method, comprising:
   generating a slave laser line fast tuned through at least a fast tuning port to at least a frequency near a reference laser line;
   frequency dividing a detected beatnote between the slave laser line and the reference laser line;
   detecting a phase difference between the divided beatnote and a reference signal to generate an error signal proportional to the phase difference;
   converting the error signal into an appropriate feedback signal to phase lock the divided beatnote to the reference signal;
   rapidly changing a slave laser frequency target based on a combination of a dynamically changing a frequency of the reference signal, a frequency dividing factor, and an effective polarity of the error signal;
   switching to a frequency detect mode to supply the error signal to drive the loop towards frequency lock and switching to an intermediary wide closed-loop mode to quickly achieve phase lock when the intermediary closed-loop mode achieves phase lock by transition into a final closed-loop state; and
   dynamically generating a feed-forward signal proportional to the phase difference for a plurality of closed-loop modes, with higher phase sensitivity for an intermediary closed loop mode before translating the error signal into two appropriate feedback signals and feeding the feedback signals to the slave laser to correct its optical frequency to accelerate frequency switching of a slave laser to a target through the fast tuning port where the feed-forward signal is selectively optimized dynamically or offline periodically.

2. The method of claim 1, further comprising:
   combining the slave laser line and the reference laser line to generate the beatnote, wherein the reference laser line comprises a fraction of a master laser or one laser line of an optical frequency comb generated from the master laser.

3. The method of claim 1, further comprising:
   generating and applying additional feed-forward signals to other tuning ports to dynamically tune the slave laser in a wider range, in conjunction with tuning through the fast tuning port; and
   rapidly tuning the slave laser line from a first frequency near a first reference laser line to a second frequency near a second reference laser line, through one or more tuning ports.

4. The method of claim 1, further comprising:
   slowly adjusting a frequency of the slave laser by changing its temperature using a temperature setting signal, and an optional slow feedback signal converted from the error signal.

5. The method of claim 1, further comprising:
   detecting a frequency difference between the divided beatnote and the reference signal, and dynamically determining the error signal by a fast locking logic to drive a loop towards frequency lock with a configurable error signal when the frequency difference exceeds a predetermined threshold.

6. The method of claim 1, wherein the frequency dividing of the beatnote comprises frequency dividing the beatnote by a factor of N to below a maximum frequency of a phase detector, where N is dynamically programmable and is a product of divider ratios $N_1, N_2, \ldots, N_N$.

7. The method of claim 1, further comprising:
   changing gains in a phase locked loop in order for an open loop gain of the phase locked loop to remain optimized, when a frequency dividing factor N and a frequency tuning response of the fast tuning port are changed.

8. The method of claim 7, further comprising:
   rapidly switching the feed-forward signals, the frequency of the reference signal, the frequency dividing factor N, the effective polarity of the error signal, the gains in the other sections of the phase locked loop, and settings of the fast locking logic based on digital commands from an electronic controller.

9. The method of claim 8, wherein the electronic controller is configured to wait on a triggering pulse to start each frequency switch of the slave laser.

10. The method of claim 8, wherein the feed-forward signal to the fast tuning port is initially estimated from the frequency tuning response of the fast tuning port, and adaptively corrected to minimize the feedback signals and the detected frequency difference between the divided beatnote and the reference signal.

* * * * *